United States Patent [19]

Hendriks

[11] Patent Number: 4,851,796
[45] Date of Patent: Jul. 25, 1989

[54] TV-RF INPUT CIRCUIT

[75] Inventor: Johannes H. Hendriks, Singapore, Singapore

[73] Assignee: U.S. Philips Corporation, New York, N.Y.

[21] Appl. No.: 208,189

[22] Filed: Jun. 16, 1988

[30] Foreign Application Priority Data

Jul. 13, 1987 [NL] Netherlands ............... 8701641

[51] Int. Cl.$^4$ ............... H03H 7/46; H04B 1/26
[52] U.S. Cl. ............... 333/129; 334/47; 455/334
[58] Field of Search ............... 333/129, 132, 32; 334/47; 455/189, 191, 280, 334, 338; 343/852, 858

[56] References Cited

U.S. PATENT DOCUMENTS

| | | | |
|---|---|---|---|
| 2,113,157 | 4/1938 | Landon et al. | 455/191 X |
| 3,593,222 | 7/1971 | Rizzi. | |
| 3,980,957 | 9/1976 | Putzer. | |
| 4,612,571 | 9/1986 | Moon | 455/191 X |

FOREIGN PATENT DOCUMENTS

| | | |
|---|---|---|
| 3538921A1 | 5/1987 | Fed. Rep. of Germany. |
| 528403 | 10/1940 | United Kingdom ............... 333/129 |

Primary Examiner—Paul Gensler
Attorney, Agent, or Firm—Edward W. Goodman

[57] ABSTRACT

TV-RF input circuit provided with an RF coupling device via which an aerial input is coupled to first, second and third parallel tunable RF resonant circuits (11, 21, 31) for a parallel selection of a desired frequency in first, second and third TV frequency bands (50–160 MHz; 160–470 MHz; 470–860 MHz) substantially succeeding one another in frequency, the RF coupling device having a high-pass $\pi$-section (C, L2, L3) for suppressing frequencies below the first TV frequency band and being provided with a capacitive series branch and first and second inductive shunt branches, the $\pi$-section (C, L2, L3) being coupled via a first series inductance (L1) to the first RF resonant circuit (11). In order to ensure, without extra elements, a substantially reflection-free supply of TV-FR reception signals to each of the RF resonant circuits, second and third series inductances (L2, L3) of mutually equal order are arranged in the first and second inductive shunt branches, respectively, which inductances are coupled at one end to either side of a capacitor (C) arranged in the capacitive series branch and at the other end to the second and third RF resonant circuits (21, 31), respecitvely, the first series inductance (L1) being at least several times larger than each of the two other series (L2, L3) inductances.

3 Claims, 1 Drawing Sheet

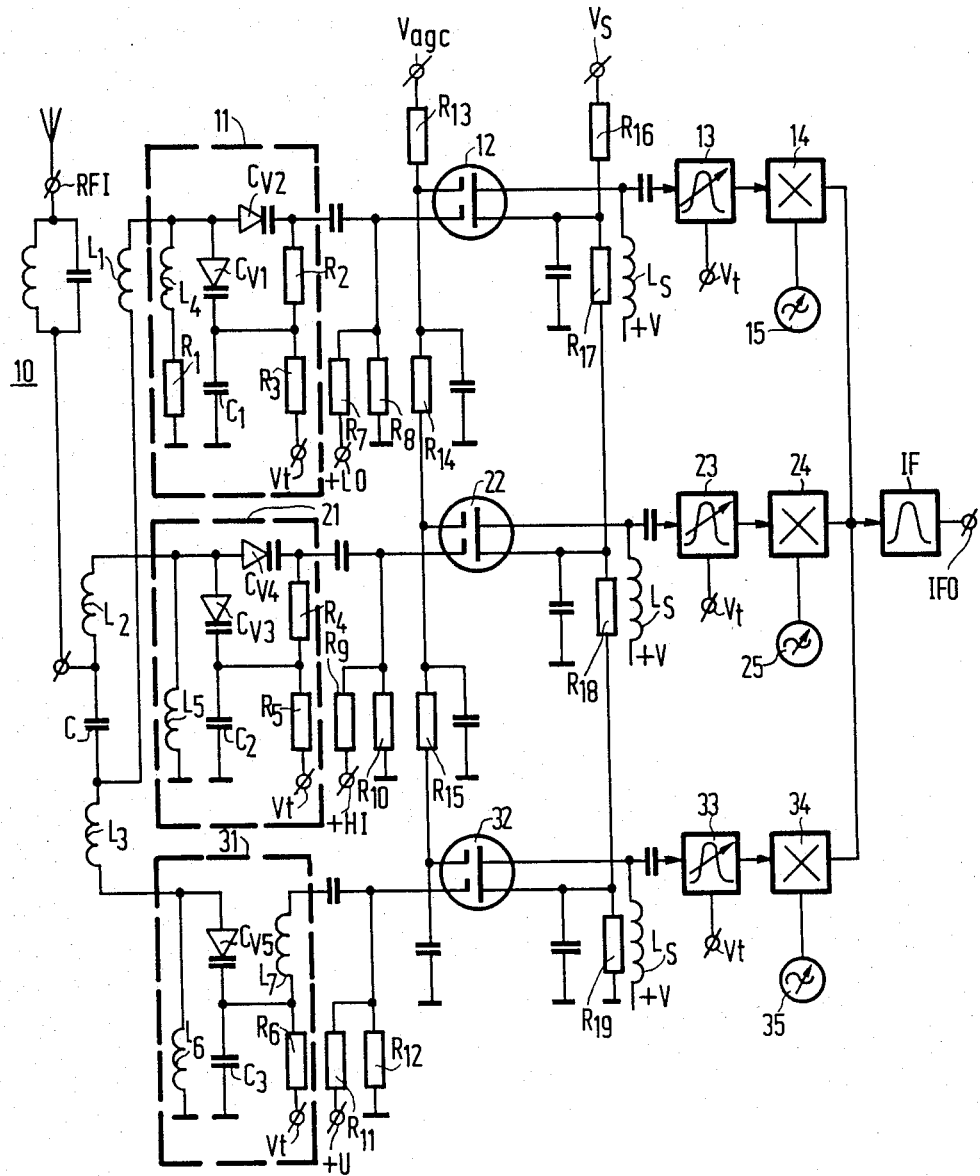

TV-RF INPUT CIRCUIT

BACKGROUND OF THE INVENTION

The invention relates to a TV-RF input circuit provided with an RF coupling device via which an aerial input is coupled to first, second and third parallel tunable RF resonant circuits for a parallel selection of a desired frequency in first, second and third TV frequency bands substantially succeeding one another in frequency, said RF coupling device having a high-pass $\pi$-section for suppressing frequencies below the first TV frequency band and being provided with a capacitive series branch and first and second inductive shunt branches, said $\pi$-section being coupled via a first series inductance to the first RF resonant circuit.

A TV-RF input circuit of this type is used in the TV tuner of the type UV 636 of Philips, described in the "Philips Data Handbook" Book C2, entitled "Television tuners", published by Philips Electronic Components and Materials of Eindhoven, February 1987.

In the known TV tuner the first, second and third RF resonant circuits are arranged in first, second and third signal paths, respectively, which are mutually parallel arranged between the coupling device, on the one hand, and a TV-IF output of the tuner on the other hand. The entire TV reception signal of the aerial is applied in a broad band via the RF coupling device to each of the RF resonant circuits. The RF resonant circuits are parallel tunable from one common tuning voltage to TV frequency bands succeeding one another substantially contiguously. With the aid of the first, second and third RF resonant circuits, a TV channel is selected in TV frequency bands of approximately 50 MHz to 270 MHz, 280 MHz to 400 MHz and 400 MHz to 800 MHz, respectively. Each signal path comprises an amplifier stage arranged downstream of the RF resonant circuit, which stage also functions as a band switch, and is followed by a further tunable TV channel filter and a mixer stage to which an oscillator mixing signal is applied from a tuning oscillator. One of the signal paths is activated by means of a switching signal, that is to say, the TV channel selected in the RF resonant circuit preceding the band switch in one of the signal paths is switched through via this band switch for a further selection and conversion into a TV-IF signal.

However, the impedance of the RF resonant circuits varies considerably with the tuning frequency. The RF coupling device should nevertheless maintain a correct impedance matching between the aerial input, on the one hand, and the RF resonant circuits, on the other hand, within the entire TV reception frequency range and it should also prevent the RF resonant circuits from noticeably loading one another.

In the RF coupling device of the known TV-RF input circuit, this is achieved by means of a switching device with which the input of the first RF resonant circuit is connected to ground when activating the third signal path, and by means of inductive coupling elements between the aerial input, on the one hand, and each of the RF resonant circuits, on the other hand. The high pass $\pi$-section is arranged in the known RF coupling device ahead of the first RF resonant circuit and suppresses signals below the TV frequency range which may give rise to interference, for example, radio signals and signals at the TV image and sound intermediate frequency.

SUMMARY OF THE INVENTION

It is an object of the invention to provide a TV-RF input circuit of the type described in the opening paragraph which has fewer circuit elements and a simpler circuit configuration than the known TV-RF input circuit.

According to the invention, such a TV-RF input circuit is therefore characterized in that second and third series inductances of mutually equal order of magnitude are arranged in the first and second inductive shunt branches, respectively, said second and third series inductances being coupled at one end to either side of a capacitor arranged in the capacitive series branch and at the other end to second and third RF resonant circuits, respectively, said first series inductance being at least several times larger than each of the two other series inductances.

When using the measure according to the invention, the series inductances prevent the RF resonant circuits from influencing one another to an undesired extent, and this without using switching elements, and the second and third series inductances together with the capacitor also constitute the high-pass $\pi$-section arranged between the aerial input and the first series inductance. The $\pi$-section thereby fulfils both a filtering and a decoupling function and provides the possibility of realizing the TV-RF input circuit in a very simple manner and at low cost.

A preferred embodiment of such a TV-RF input circuit according to the invention is characterized in that the first, second and third series inductances at least partly compensate impedance variations of the RF resonant circuits respectively coupled thereto for tuning variations within the first, second and third TV frequency bands, respectively, and match these impedances with the aerial impedance.

This measure is based on the recognition that a dimensioning of the series inductances and the RF resonant circuits is possible in the aforementioned circuit configuration, while also an acceptable impedance matching between the aerial input and each RF resonant circuit is obtained while maintaining the two aforementioned functions of the $\pi$-section. When using this measure, the standing-wave ratio at the aerial input can be kept within acceptable limits in a simple manner and at low cost without using extra elements.

A practical preferred embodiment, in which the first, second and third TV frequency bands are substantially between 50 and 160 MHz, 160 and 470 MHz, and 470 and 860 MHz, is characterized in that the capacitor is of the order of 35 pF and in that the first, second and third series inductances are of the order of 350 nH, 100 nH and 100 nH, respectively.

BRIEF DESCRIPTION OF THE DRAWING

The invention will now be described in greater detail, by way of example, with reference to the accompanying drawing comprising a sole Figure for the purpose of illustration.

DESCRIPTION OF THE PREFERRED EMBODIMENT

The Figure shows a TV input circuit according to the invention which is incorporated in a TV tuner having an RF aerial input RFI and an intermediate frequency output IFO. The TV-RF input circuit comprises an IF trap filter 10 for suppressing signals at the TV image and sound intermediate frequency, via which the RF aerial input RFI is coupled to an input of a high-pass $\pi$-section C, L2, L3. The $\pi$-section C, L2, L3 comprises in a $\pi$-configuration a capacitor C arranged in a capacitive series branch one end of which is connected to the input end of the $\pi$-section and is coupled to a first inductive shunt branch and the other end of which is connected to the output end of the $\pi$-section and is coupled to a second inductive shunt branch. The output of the $\pi$-section is coupled to a first RF resonant circuit 11 via a coupling coil L1 functioning as a so-called first series inductance. The first and second inductive shunt branches are constituted by coupling coils L2 and L3, respectively functioning as so-called second and third series inductances. As said coils L1–L3 function as impedance transformers, they are indicated hereinafter as transformation coils.

First, second and third signal paths (11–14), (21–24) and (31–34) are mutually arranged in parallel between the transformation coils L1–L3, on the one hand, and an input of a TV-IF filter IF, on the other hand. These signal paths substantially correspond to one another in their circuit configuration and signal processing. These first, second and third signal path comprise the above-mentioned first RF resonant circuit 11, and second and third RF resonant circuits 21 and 31, each being connected to the transformation coils L1, L2 and L3, respectively, and which are simultaneously parallel tunable, from a tuning voltage $V_t$, which is common for all circuits, to first, second and third TV frequency bands I, II and III of 50–160 MHz, 160–470 MHz and 470–860 MHz, respectively. The RF resonant circuits 11, 21 and 31 are coupled via coupling capacitors to first gate inputs of dual gate field effect transistors FET 12, 22 and 32, respectively.

The FETs 12, 22 and 32 are gain-controllable from a common gain control voltage $V_{agc}$ which is applied to second gate inputs of these FETs 12, 22 and 32 via resistors R13; R13, R14; and R13, R14 and R15, respectively, the resistors R13–R15 being successively arranged in series between $V_{agc}$ and ground. These second gate inputs are connected to ground for radio frequency via decoupling capacitors. The FETs 12, 22 and 32 also have a switching function, that is to say, they can be switched on or off by means of a band switching voltage, which is applied to the respective first gate inputs via switching signal inputs LO, HI and U, and voltage dividers R7, R8; R9, R10 and R11, R12, respectively. The band switching voltages for the FETs 12, 22 and 32 are chosen to be such that each time only one of these FETs is in an activated state and functions as a controllable amplifier, whereas the two other FETs are inactivated and are blocked.

The sources of the FETs 12, 22 and 32 are connected to suitably chosen supply voltage values which are obtained from the common junction point of resistors R16, R17; R17, R18 and R18, R19, respectively, of a resistance series circuit R16–R19 arranged between a supply voltage $V_s$ and ground. These sources are connected to ground for radio frequency via decoupling capacitors.

The drains of the FETs 12, 22 and 32 are coupled to the supply voltage $+V$ via DC voltage supply coils Ls, on the one hand, and to further tunable RF resonant circuits 13, 23 and 33 via coupling capacitors, on the other hand, the further tunable RF resonant circuits being followed by mixer stages 14, 24 and 34 to which tunable local oscillator signals are applied from tuning oscillators 15, 25 and 35 for a frequency conversion of the selected RF-TV signal into an IF-TV signal. The outputs of the mixer stages 14, 24 and 34 are connected to the common TV-IF filter IF which supplies a selected TV-IF signal from the IF output IFO.

When tuning to a TV channel in the first TV frequency band, the first signal path is operative, whereas the two other signal paths are switched off. In this state a TV-IF signal is applied to IF from the first signal path only. The same applies mutatis mutandis to the second and third signal paths when tuning to a TV channel in the second and third TV frequency bands.

The tunable RF resonant circuits 11, 21 and 31 substantially correspond to one another in their circuit configuration. Each of them comprises a tunable parallel LC circuit to which a TV frequency band is applied via the relevant transformation coil, a tuning voltage $V_t$ which is common for all circuits being applied via a tuning input. With suitable dimensioning, it is achieved that the circuits are mutually parallel tunable from $V_t$ to frequencies within the respective TV frequency bands. The RF resonant circuits 11, 21 and 31 are constituted by a circuit coil L4 in series with a resistor R1 across which a series arrangement of a variable capacitance diode Cv1 and a DC blocking capacitor C1 is connected in parallel, by a circuit coil L5 across which a series arrangement of a variable capacitance diode Cv3 and a DC blocking capacitor C2 is connected in parallel, and by a circuit coil L6 across which a series arrangement of a variable capacitance diode Cv5 and a DC by-pass capacitor C3 is connected in parallel, respectively. The anodes of Cv1, Cv3 and Cv5 are connected to the top of the circuits 11, 12 and 13, respectively. The tuning voltage $V_t$, which is common for the circuits 11, 21 and 31, is applied to the cathodes of Cv1, Cv3 and Cv5 via resistors R3, R5 and R6, respectively.

Due to the large range of capacitance variation which is required in the circuits 11 and 21 to obtain a tuning variation over the first and second TV frequency bands of 50–160 MHz and of 160–470 MHz which are comparatively broad with respect to the third TV frequency band, the impedances of the circuits 11 and 21 also vary to a comparatively considerable extent. In order to compensate these impedance variations to a sufficient extent and to maintain an acceptable impedance matching between these circuits 11 and 21, on the one hand and the FETs 12 and 22, on the other hand, within the tuning range, a series arrangement of a variable capacitance diode Cv2 and a resistor R2 is connected parallel across Cv1 in circuit 11, and a series arrangement of a variable capacitance diode Cv4 and a resistor R4 is connected parallel across Cv3 in circuit 21. The anodes of Cv2 and Cv4 are connected to the anodes of Cv1 and Cv3, respectively, while the cathodes of Cv2 and Cv4 are connected to the outputs of the circuits 11 and 21, respectively. The cathode of Cv5 is connected to the output of the circuit 31 via a coil L7.

In the embodiment shown, the TV-RF reception signal received at the aerial is applied to the $\pi$-section C, L2, L3 after IF signal suppression. For the TV frequency range the IF trap filter 10 may be assumed to be short-circuited. For signals at the lower end of the TV frequency range, for example for the first TV frequency band of 50–160 MHz, the circuits 21 and 31 substantially constitute a short circuit or at most a small inductance via the circuit coils L5 and L6, and the transformation coils L2 and L3 of the $\pi$-section seem to be connected to ground. The $\pi$-section is dimensioned in such a manner that, on the one hand, at least for signals in the first TV frequency band, it has a high-pass edge just below the lowest TV reception frequency, for example, at approximately 45 MHz so that unwanted signals, such as, for example, RF radio reception signals, are suppressed and, on the other hand, it has an input impedance which, at least for the first TV frequency band, approximates the aerial impedance to a sufficiently accurate extent in order to realize an acceptable impedance matching (standing-wave-ratio between 1 and 3) within this frequency range.

However, the impedance of the circuit 11 varies considerably with the tuning frequency. With the aid of the transformation coil L1, the impedance variation of this circuit 11 within the TV frequency band I at the output of the π-section C, L2, L3 is reduced in such a manner that an acceptable low-loss impedance match is also obtained in this case. Signals in the first TV frequency band are thus applied to the first RF resonant circuit 11 from the aerial substantially without any reflection and without any noticeable loss of energy in the circuits 21 and 31.

For signals in the second and third TV frequency bands, the capacitor C is substantially short-circuited and L2 and L3 seem to be connected in common to the output of the IF trap filter 10. The value of transformation coil L1 is chosen to be several times larger than that of L2 and L3 so that L1 blocks the supply of the last-mentioned signals to the first RF resonant circuit 11. The coils L2 and L3, which as stated hereinbefore form part of the high-pass π-section C, L2, L3, also realize such a reduction of the impedance variation of the circuits 21 and 31 that the series arrangement of L2 and the circuit 21 for signals in the second TV frequency band and the series circuit of L3 and the circuit 31 for signals in the third TV frequency band, respectively, is adapted to the aerial impedance substantially without any reflection.

For signals in the second TV frequency band, the series arrangement of L3 and the circuit 31 constitutes an inductance in which no signal losses occur, and conversely, the series arrangement of L2 and the circuit 21 constitutes an inductance which is substantially free from loss for signals in the third TV frequency band. Consequently, signals in the second and third TV frequency bands are applied from the aerial substantially without any reflection and without any noticeable loss of energy in the circuits 11 and 31 and 11 and 21 to the second and third RF resonant circuits 21 and 31, respectively.

In a practical embodiment in which, as described above, the TV reception frequency ranges of 50–160 MHz, 160–470 MHz and 470–860 MHz were chosen as first, second and third TV frequency bands, respectively, the resistor R1 had a value of 3Ω, the resistors R2 and R4 were of the order of 50 KΩ and R3, R5, R6 were of the order of 10 KΩ the coils L1–L7 were of the order of 350, 100, 100, 400, 30, 20 and 10 nH, respectively, the capacitor C had a value of approximately 35 pF and the capacitors C1–C3 were of the order of 1 nF. The variable capacitance diodes Cv1 and Cv3 were of the type BB 909, Cv2 and Cv4 were of the type BW 801 and Cv5 was of the type BB 405, while the tuning voltage $V_t$ varied in a voltage range between 0.5 V and 28 V. The aerial impedance was 75Ω while the standing wave ratio was between 1 and 3.

It is evident that the invention is not limited to the above-mentioned embodiment which is shown in the Figure. In the case of a sufficient IF signal suppression in the high-pass π-section C, L2, L3, it is very well possible to dispense with the IF trap filter 10 and/or to interchange the second transformation coil L2 with the second signal path 21–24 coupled thereto and the third transformation coil L3 with the third signal path 31–34 coupled thereto, that is to say, to arrange L3 at the input end of the π section and to arrange L2 together with L1 at the output end of the π-section. The inventive concept can also be used for a different choice of TV frequency bands and/or when dividing the TV frequency range into more than 3 TV frequency bands. Instead of FETs, bipolar transistors may alternatively be used as amplifier stages. In this case an impedance matching between the RF resonant circuits, on the one hand, and the bipolar transistors, on the other hand, can be realized by means of extra transformation coils instead of variable capacitance diodes.

What is claimed is:

1. A TV-RF input circuit provided with an RF coupling device via which an aerial input is coupled to first, second and third parallel tunable RF resonant circuits for a parallel selection of a desired frequency in first, second and third TV frequency bands substantially succeeding one another in frequency, said RF coupling device having a high-pass π-section for suppressing frequencies below the first TV frequency band and being provided with a capacitive series branch and first and second inductive shunt branches, said π-section being coupled via a first series inductance to the first RF resonant circuit, characterized in that second and third series inductances of mutually equal order of magnitude are arranged in the first and second inductive shunt branches, respectively, said second and third series inductances being coupled at one end to either side of a capacitor arranged in the capacitive series branch and at the other end to second and third RF resonant circuits, respectively, said first series inductance being at least several times larger than each of the two other series inductances.

2. A TV-RF input circuit as claimed in claim 1, characterized in that the first, second and third series inductances at least partly compensate in variations in impedances of the RF resonant circuits respectively coupled thereto for tuning variations within the first, second and third TV frequency bands, respectively, and match said impedances with an aerial impedance.

3. A TV-RF input circuit as claimed in claim 2, characterized in that the first, second and third TV frequency bands are substantially between 50 and 160 MHz, 160 and 470 MHz, and 470 and 860 MHz, in that the capacitor is of the order of 35 pF and in that the first, second and third series inductances are of the order of 350 nH, 100 nH and 100 nH, respectively.

* * * * *